LIGHT-SENSITIVE PHOTOMECHANICAL RESIST COMPOSITIONS
Filed Dec. 30, 1953
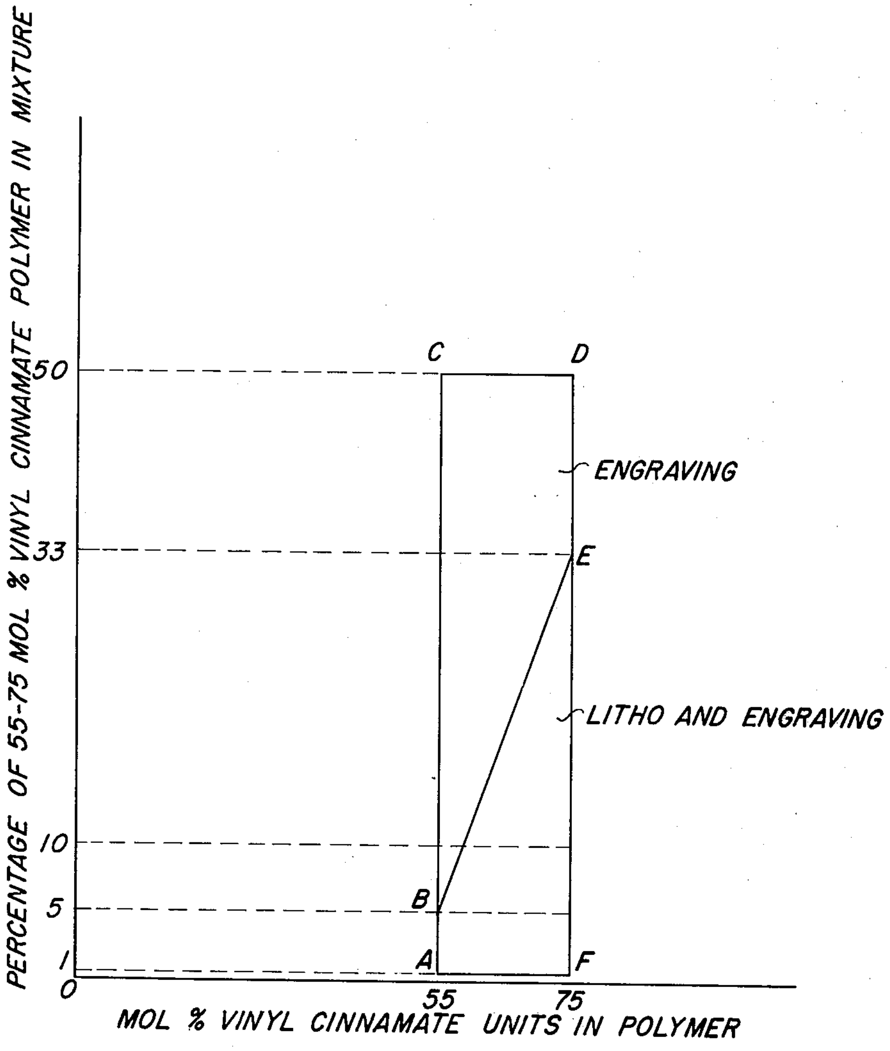
JOSEPH J. MURRAY
GERHARD W. LEUBNER
INVENTORS
BY David I. Mayne
W. H. McDowell
ATTORNEY & AGENT United States Patent Office 2,739,892

Patented Mar. 27, 1956

2,739,892

LIGHT-SENSITIVE PHOTOMECHANICAL RESIST COMPOSITIONS

Joseph J. Murray and Gerhard W. Leubner, Rochester, N. Y., assignors to Eastman Kodak Company, Rochester, N. Y., a corporation of New Jersey Application December 30, 1953, Serial No. 401,258

4 Claims. (Cl. 95—7)

This invention relates to light-sensitive polymeric compositions of particular use in the graphic arts.

Light-sensitive polymeric compositions have previously been described which are especially useful in the lithographic and engraving processes of the graphic arts. For example, cinnamic acid ester polymer compositions of the Minsk and Van Deusen U. S. patent application Serial No. 207,048, filed January 20, 1951, have been found to be particularly useful in lithographic and engraving work for the preparation of resist images on various supports such as zinc, aluminum, copper and magnesium. As disclosed therein, layers of a cinnamic acid ester of polyvinyl alcohol on metal plates are exposed under line or halftone subjects and the unexposed areas of the sensitive layers are removed with solvent leaving polymeric resist images on the metal plates. However, it has been found that different batches of the light-sensitive cinnamic acid esters of polyvinyl alcohol prepared under substantially the same conditions differ appreciably in their plate-making and printing qualities. One batch of polyvinyl cinnamate may be perfectly satisfactory for use in both lithographic work on zinc plates as well as for engraving on copper plates. The next batch of polyvinyl cinnamate may unexpectedly not be as suitable for lithographic work because of poor ink differentiation although the polymer is satisfactory for preparation of a resist for engraving purposes. One difficulty in particular with the cinnamic acid ester of polyvinyl alcohol is its tendency in an engraving process to strip from the metal surface such as a copper plate after exposure of the polymer layer and development of the resist image with an organic solvent.

We have discovered that the processing latitude of exposed coatings of polyvinyl cinnamate resist and the repeatability of high quality batches, judging by adhesion during processing and during use of the resulting image can be greatly improved if there is added to a light-sensitive composition containing a substantially fully esterified polyvinyl cinnamate polymer, a certain amount of a less fully esterified polyvinyl cinnamate, yet the ink differentiation of a resist image prepared from the mixture of polymers in a lithographic process is not adversely affected. However, addition of too much of the less esterified polymer to the composition containing the fully esterified polymer renders the composition of limited value in lithographic work because of poor ink differentiation of the resist.

Our invention therefore includes the preparation of light-sensitive compositions and coatings therefrom of a mixture of a polymer containing in its molecule approximately 100 mol percent of vinyl cinnamate units having the structure $$-CH_2-\underset{\displaystyle O-CO-CH=CH-C_6H_5}{\underset{|}{CH}}-$$

and about 1 to 50 percent by weight based on the amount of 100 mol percent esterified polyvinyl cinnamate present, of a second polyvinyl cinnamate polymer containing from about 55 to 75 mol percent of the above recurring vinyl cinnamate units, the remaining recurring units (45 to 25 mol percent) being vinyl alcohol units having the structure $$-CH_2-\underset{\displaystyle OH}{\underset{|}{CH}}-$$

The preparation of the fully esterified polymer is provided in the above Minsk et al. invention whereby polyvinyl alcohol is substantially fully esterified with cinnamoyl chloride. The accompanying drawing illustrates this range of concentration of the less fully esterified polyvinyl cinnamates based on the fully esterified polyvinyl cinnamate polymer (area ACDF). The compositions represented thereby are all useful for engraving processes such as customarily carried out on copper plates and by virtue of the presence of the less esterified polymer in the composition, the resist images obtained thereby adhere well to the metal plate. Polymer mixtures represented by area ABEF of the figure of the drawing are useful for both lithographic and engraving work thus, it is not necessary to supply the trade with separate formulas for the different graphic arts processes. The formulas containing about 1 to 5 percent of the 55 mol percent esterified polymer are particularly valuable in this respect.

Compositions lying in area BCDE contain too much partially esterified polymer to be of much use in lithographic processes although the compositions are very useful in engraving processes, that is, the compositions represented by area BCDE contain, for example, more than 33 percent of the 75 mol percent esterified polymer or more than 5 percent of a 55 mol percent esterified polymer, etc., which render the exposed or non-image regions of the composition, or coating more difficult to remove from the hydrophilic metal with preferred developing solvents leaving an undesirable hydrophobic coating residue on these non-image areas of the support to cause the printing plate obtained to scum in the non-image areas. Polyvinyl cinnamates having less than about 55 mol percent cinnamic ester groups are difficult to dissolve and as is apparent from the drawing, have limited usefulness in either lithographic or engraving processes. Compositions falling to the right of area ABDF of the drawing are not very practical since appreciably larger quantities of the esters more than 75 mol percent esterified, are required to produce any appreciable improvement in adhesion of the coatings in engraving processes. Moreover, as is apparent from the drawing, very small quantities (1 to 4 percent) of the 55 mol percent esterified polymer exert a pronounced effect on the quality of the compositions. In the drawings, the co-ordinates of points A, B, C, D, E and F are (1, 55), (5, 55), (50,55), (50, 75), (33, 75) and (1, 75), respectively.

The 55 to 75 mol percent esterified polyvinyl cinnamate polymers used in the composition were prepared in the same manner as the fully esterified polyvinyl cinnamate by heating polyvinyl alcohol with varying amounts of cinnamoyl chloride in pyridine using the methods of the above Minsk et al. invention. The following table shows the proportions of reactants used in obtaining polymers containing from about 55 to 75 mol percent cinnamic acid ester groups.

| Sample No. | Molecular Equivalent Amount Cinnamoyl Chloride Used | Mol Percent Vinyl Cinnamate |
|---|---|---|
| 804A | 90 | 75.5 |
| 804B | 85 | 69.5 |
| 804C | 80 | 65.0 |
| 804D | 75 | 59.4 |
| 804E | 70 | 54.0 |

When the above polymer samples were incorporated into an ethylene glycol monomethyl ether acetate solution of substantially fully esterified polyvinyl cinnamate and the solution coated on a metal plate, appreciable improvement in plate characteristics particularly of engraved copper plates was obtained. For example, when sample 804D was added to a polyvinyl cinnamate composition (2 percent of 804D based on the polyvinyl cinnamate present), results comparable to the blend of 33 percent of sample 804A was obtained. However, when more than about 10 percent of sample 804E (54 percent esterified) was added and a resist prepared on a zinc lithographic plate, scumming was obtained for the reasons mentioned, but not when either 4 percent of the 54–59.4 percent esterified esters or 10 percent of the 75.5 percent esterified ester was employed in the composition.

The coating compositions of the invention may contain in addition to the mixture of polymers of different esterification value a sensitizing agent such as the nitro compound sensitizing agents of U. S. Patent 2,610,120; triphenyl methane, anthrone, quinone and ketone sensitizers of the Minsk et al. U. S. patent application Serial No. 207,048–51 filed January 21, 1951, as well as the thiazole sensitizers of the Robertson et al. U. S. patent application Serial No. 314,806 filed October 15, 1952, for example, Crystal Violet carbinol base, 2,4,6-trinitroaniline, 1,2-benzanthraquinone, 4,4'-tetramethyldiaminodiphenyl ketone or 1-methyl-2-benzoylmethylene-β-napthothiazoline. The latter compound is especially useful in the mixed polymer compositions of the invention. The sensitizing agents can be used in about 10 percent concentration based on the total amount of light-sensitive polymer in the composition.

The mixed polymer compositions of the invention may be prepared by dissolving the polymers in solvents such as ethylene glycol monomethyl ether acetate or other solvents or solvent combinations disclosed in the Minsk et al. U. S. patent application Serial No. 207,050 filed January 20, 1951. Coatings of the compositions may be applied to various surfaces such as zinc, aluminum, magnesium and copper by methods and for the purposes outlined in the invention immediately above. Accordingly, lithographic printing plates are prepared readily by coating the compositions on bimetallic plates, cellulose ester sheets, grained zinc or aluminum or zinc-coated aluminum plates. For engraving purposes, the polymer compositions can be coated on degreased copper plates or zinc plates. An especially good method for developing resist images in the exposed light-sensitive polymer coatings on these plates is to subject the coatings to trichloroethylene vapor which readily removes the unexposed areas of the coatings. Development may also be carried out by squeegee development with a protective plastic film over the plate.

After preparation of the insoluble resist image on such surfaces, other steps usually employed in the lithographic and engraving processes can then be carried out. These include in lithographic work treatment of the plate carrying the ink-receptive polymer resist image with gum-free "desensitizing etches" such as solutions containing phosphoric acid. In engraving work, after preparation of the mixed polymer resist image on the metal plate etching may be carried out as desired, the polymer resist preventing the etching solution from attacking the plate in the areas occupied by the resist.

What we claim is:

1. A light-sensitive photomechanical resist composition comprising a mixture of a polymer containing approximately 100 mol percent of recurring vinyl cinnamate units having the formula $$-CH_2-\underset{\displaystyle |\atop O-CO-CH=CH-C_6H_5}{CH}-$$

and from about 1 to 50 percent by weight based on said polymer, of a second polymer containing from about 55 to 75 mol percent of said recurring units and from about 45 to 25 mol percent of recurring vinyl alcohol units.

2. A light-sensitive photomechanical resist composition comprising a mixture of a polymer containing approximately 100 mol percent of recurring vinyl cinnamate units having the formula $$-CH_2-\underset{\displaystyle |\atop O-CO-CH=CH-C_6H_5}{CH}-$$

and an amount designated by area ABEF of the figure of the accompanying drawing, of a second polymer containing from about 55 to 75 mol percent of said recurring units and from about 45 to 25 mol percent of recurring vinyl alcohol units.

3. A light-sensitve photomechanical resist composition comprising a mixture of a polymer containing approximately 100 mol percent of recurring vinyl cinnamate units having the formula $$-CH_2-\underset{\displaystyle |\atop O-CO-CH=CH-C_6H_5}{CH}-$$

and the amount designated in area BCDE of the figure of the accompanying drawing, of a second polymer containing from about 55 to 75 mol percent of said recurring units and from about 45 to 25 mol percent of recurring vinyl alcohol units.

4. A light-sensitive photomechanical resist composition comprising a mixture of a polymer containing approximately 100 mol percent of recurring vinyl cinnamate units having the formula $$-CH_2-\underset{\displaystyle |\atop O-CO-CH=CH-C_6H_5}{CH}-$$

and from about 1 to 5 percent by weight based on said polymer, of a second polymer containing about 55 mol percent of said recurring units and about 45 mol percent of recurring vinyl alcohol units.

References Cited in the file of this patent

UNITED STATES PATENTS

| | | |
|---|---|---|
| 2,610,120 | Minsk et al. | Sept. 9, 1952 |
| 2,670,285 | Minsk et al. | Feb. 23, 1954 |